(12) United States Patent
Takai et al.

(10) Patent No.: US 11,682,566 B2
(45) Date of Patent: Jun. 20, 2023

(54) PROCESSING APPARATUS FOR PROCESSING SUBSTRATES OF DIFFERENT TYPES

(71) Applicant: KIOXIA CORPORATION, Tokyo (JP)

(72) Inventors: Kosuke Takai, Yokohama Kanagawa (JP); Mana Tanabe, Yokohama Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 144 days.

(21) Appl. No.: 17/238,455

(22) Filed: Apr. 23, 2021

(65) Prior Publication Data

US 2021/0242042 A1 Aug. 5, 2021

Related U.S. Application Data

(62) Division of application No. 16/120,108, filed on Aug. 31, 2018, now abandoned.

(30) Foreign Application Priority Data

Jan. 17, 2018 (JP) .............................. JP2018-005747

(51) Int. Cl.
*H01L 21/67* (2006.01)
*B08B 7/00* (2006.01)
(Continued)

(52) U.S. Cl.
CPC ...... *H01L 21/67051* (2013.01); *B08B 7/0014* (2013.01); *B08B 7/0092* (2013.01);
(Continued)

(58) Field of Classification Search
None
See application file for complete search history.

(56) References Cited

U.S. PATENT DOCUMENTS 5,748,435 A * 5/1998 Parkhe ................ G03F 7/70708
361/234
2010/0083986 A1* 4/2010 Kamikawa ........ H01L 21/67051
134/26
(Continued)

FOREIGN PATENT DOCUMENTS

JP H08236497 A 9/1996
JP 2008028008 A 2/2008
(Continued)

*Primary Examiner* — Binu Thomas
(74) *Attorney, Agent, or Firm* — Kim & Stewart LLP

(57) ABSTRACT

According to one embodiment, a processing apparatus for processing substrates having different base shapes includes a stage comprising a first portion having a substrate facing surface and an opening extending therethough connected to a source of a cooling fluid, and a second portion located outwardly of the first portion, a substrate support, having a substrate support surface thereon, extending over the second portion, a process fluid outlet overlying the first portion, and a driving unit coupled to one of the stage and the first portion, wherein the driving unit is configured to move at least one of the substrate support surface and the substrate facing surface such that the relative locations of the substrate support surface and the substrate facing surface of the stage are changeable based on the shape of a substrate to be processed in the apparatus.

15 Claims, 7 Drawing Sheets

(51) Int. Cl.
*H01L 21/68* (2006.01)
*H01L 21/687* (2006.01)
(52) U.S. Cl.
CPC .... *H01L 21/6715* (2013.01); *H01L 21/67109* (2013.01); *H01L 21/67248* (2013.01); *H01L 21/68* (2013.01); *H01L 21/68785* (2013.01)

(56) References Cited

U.S. PATENT DOCUMENTS

| | | | |
|---|---|---|---|
| 2010/0132742 A1* | 6/2010 | Tomita | H01L 21/67051 |
| | | | 134/133 |
| 2011/0048469 A1 | 3/2011 | Ogata et al. | |
| 2011/0059406 A1 | 3/2011 | Kawamura et al. | |
| 2012/0160278 A1* | 6/2012 | Higashijima | H01L 21/67051 |
| | | | 134/33 |
| 2012/0222700 A1 | 9/2012 | Ota | |
| 2013/0272686 A1 | 10/2013 | Okada et al. | |
| 2014/0072668 A1 | 3/2014 | Yoneda et al. | |
| 2014/0261163 A1* | 9/2014 | Kishita | H01L 21/67051 |
| | | | 118/52 |
| 2015/0064809 A1 | 3/2015 | Lubomirsky | |
| 2015/0243542 A1 | 8/2015 | Yoshihara et al. | |
| 2016/0247673 A1 | 8/2016 | Tsuji et al. | |
| 2017/0274427 A1 | 9/2017 | Sakurai et al. | |
| 2018/0033673 A1* | 2/2018 | Nemani | H01L 21/67098 |
| 2018/0047559 A1* | 2/2018 | Kamiya | H01L 21/67109 |
| 2018/0182645 A1* | 6/2018 | Nakano | H01L 21/67051 |

FOREIGN PATENT DOCUMENTS

| | | |
|---|---|---|
| JP | 4906418 B2 | 3/2012 |
| JP | 2012182384 A | 9/2012 |

\* cited by examiner

PROCESSING APPARATUS FOR PROCESSING SUBSTRATES OF DIFFERENT TYPES

CROSS-REFERENCE TO RELATED APPLICATIONS

This application is a division of U.S. patent application Ser. No. 16/120,108, filed on Aug. 31, 2018, which is based upon and claims the benefit of priority from Japanese Patent Application No. 2018-005747, filed Jan. 17, 2018, the entire contents of each of which are incorporated herein by reference.

FIELD

Embodiments described herein relate generally to a processing apparatus.

BACKGROUND

In the related art, a cleaning technique is known in which a cooling medium is brought into contact with a back surface of a substrate such as a semiconductor substrate, whereby a liquid film supplied to a front surface of the substrate solidifies or "freezes" to form a frozen film layer and foreign substances on the front surface of the substrate are removed by subsequent removal of the frozen film layer.

Incidentally, examples of templates used in imprinting include a flat plate-like template and a template in which a recess portion is provided on a surface opposite to a pattern formation surface thereof. However, the related art does not cope with cleaning of templates in which plural different types of these templates are mixed.

DETAILED DESCRIPTION

An embodiment provides a processing apparatus capable of processing both a substrate including a flat lower surface and a substrate including a recess portion provided on a lower surface thereof.

In general, according to one embodiment, a processing apparatus for processing substrates having different base shapes includes a stage comprising a first portion having a substrate facing surface and an opening extending therethough connected to a source of a cooling fluid, and a second portion located outwardly of the first portion, a substrate support, having a substrate support surface thereon, extending over the second portion, a process fluid outlet overlying the first portion, and a driving unit coupled to one of the stage and the first portion, wherein the driving unit is configured to move at least one of the substrate support surface and the substrate facing surface such that the relative locations of the substrate support surface and the substrate facing surface of the stage are changeable based on the shape of a substrate to be processed in the apparatus.

Processing apparatuses according to embodiments will be described in detail below with reference to the accompanying drawings. It should be noted that the invention is not limited by these embodiments.

First Embodiment

Figure 1A:
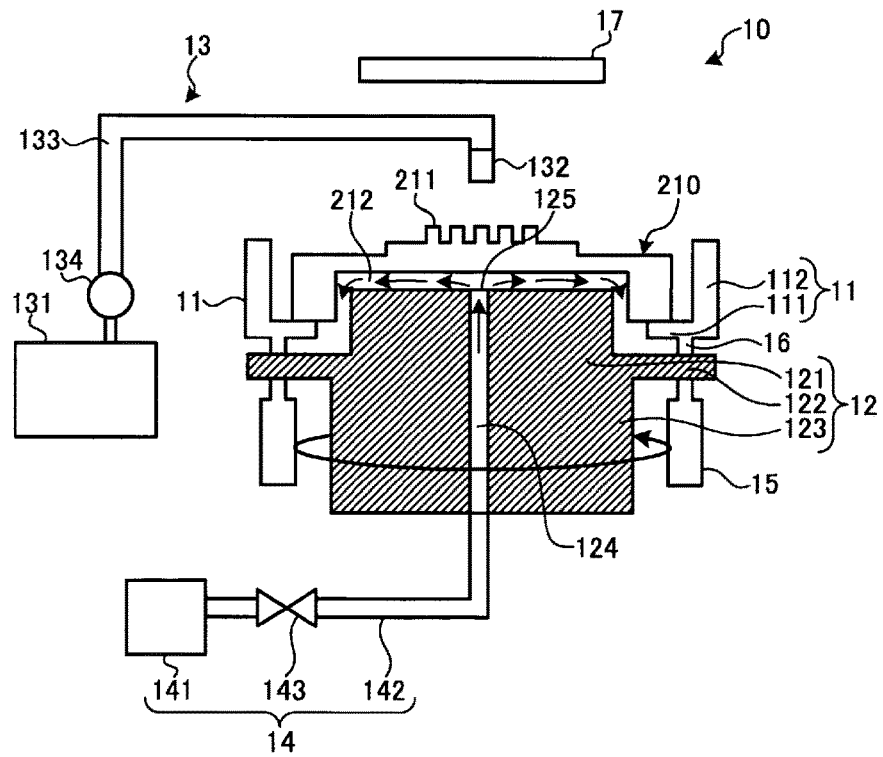
FIGS. 1A and 1B are cross-sectional views schematically illustrating an example of a configuration of a processing apparatus according to a first embodiment.
Figure 1B:
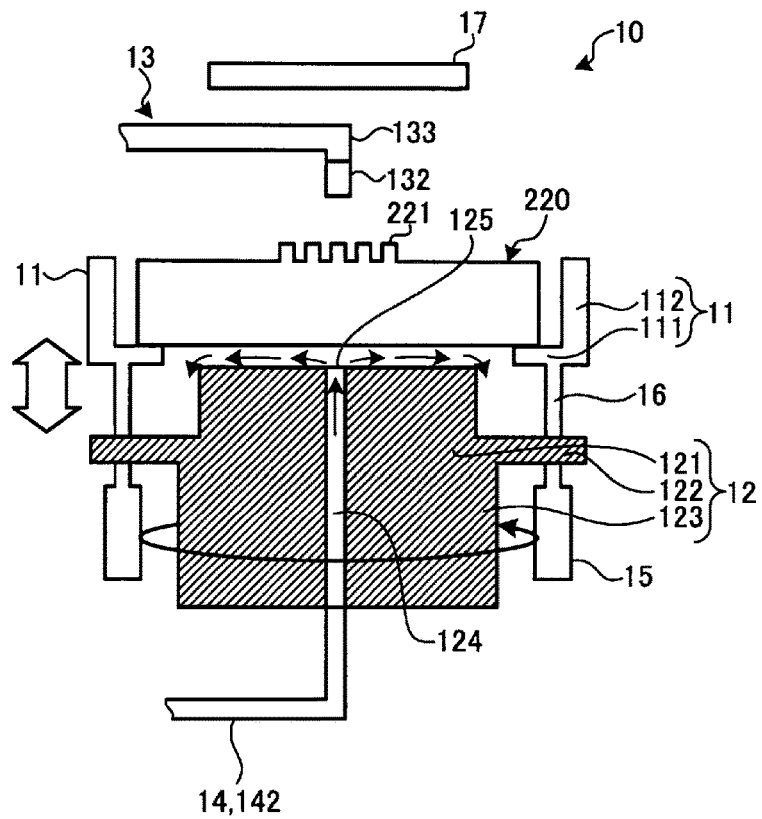
Figure 2:
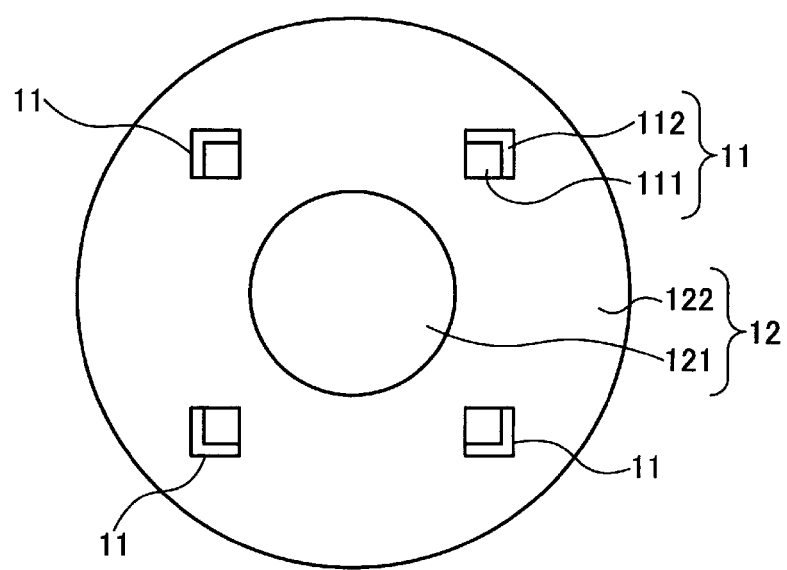
FIG. 2 is a top view schematically illustrating an example of a configuration of a stage including a substrate support member provided in the processing apparatus according to the first embodiment.

FIGS. 1A and 1B are cross-sectional views schematically illustrating an example of a configuration of a processing apparatus according to a first embodiment; FIG. 1A is a view illustrating a processing state of a replica template including a recess portion on a lower surface thereof, and FIG. 1B is a view illustrating a processing state of a flat plat-like master template. FIG. 2 is a top view schematically illustrating an example of a configuration of a stage including a substrate support member provided in the processing apparatus according to the first embodiment.

The processing apparatus is an apparatus for solidifying or "freezing" a processing liquid film formed on an upper surface of a substrate, by bringing a cooling medium into contact with a lower surface of the substrate and then thawing and rinsing the frozen processing liquid film, and thereby removing foreign substances adhered to the upper surface of the substrate. In the following embodiments, a case where the substrate is a template used in resist imprinting will be described as an example. Two types of templates, for example, a master template and a replica template are used as the template used in imprinting.

A master template 220 is a template serving as a base for forming a replica template 210, and an uneven pattern 221 is disposed on one main surface (hereinafter, referred to as an upper surface) of the flat plat-like template substrate as illustrated in FIG. 1B. In addition, a main surface (hereinafter, referred to as a lower surface) facing the upper surface has no pattern or recess thereon or therein and is flat. The replica template 210 is a template formed using the master template 220, and is a template to be used at the time of actual imprinting of the resist. As illustrated in FIG. 1A, the replica template 210 includes an uneven pattern 211 on an upper surface as a negative image pattern to that of the uneven pattern 221 of the master template 220, and includes a recess 212 on a lower surface thereof. The recess 212 is provided corresponding to a predetermined region including under the region in which the uneven pattern 211 is disposed on the upper surface. In this manner, the master template 220 is different in the shape of the lower surface as compared to the replica template 210. In the following description, the master template 220 and the replica template 210 are simply referred to as a template when there is no need to distinguish them.

As illustrated in FIG. 1, the processing apparatus 10 according to the first embodiment includes a substrate support member 11, a stage 12, a processing liquid supply unit 13, and a cooling medium supply unit 14.

The substrate support member 11 is a member for supporting the templates 210 and 220, and is provided on the stage 12. For example, as illustrated in FIG. 2, the substrate support members 11 are provided at four corner positions at which the corners of the templates 210 and 220 are disposed. The substrate support member 11 includes support surfaces 111 that support the lower surfaces of the corners of the templates 210 and 220 and sidewalls 112 that function as a stop surface for preventing movement of the templates 210 and 220 in a horizontal direction of the Figure. When the templates 210 and 220 are placed on the substrate support members 11, the position of the support surface 111 is adjusted so that a pattern formation surface, on which the uneven patterns 211 and 221 of the templates 210 and 220 are formed, is horizontal.

Each of the substrate support members 11 is connected to an elevating cylinder 15, which is a driving unit, via a rod 16. The elevating cylinder 15 is fixed to the stage 12. The substrate support member 11 is movable in a vertical direction (up and down direction) by operation of the elevating cylinder 15. In a case of cleaning the replica template 210 including the recess 212 on the lower surface thereof, the substrate support member 11 is positioned at a first position illustrated in FIG. 1A by the elevating cylinder 15. Further, in a case of cleaning the master template 220 in which the lower surface is flat, the substrate support member 11 is positioned by the elevating cylinder 15 at a second position illustrated in FIG. 1B which is higher than the first position.

The stage 12 is a member for supporting the templates 210 and 220 within the substrate support members 11. A through hole 124 penetrating the stage 12 in the vertical direction is provided near the center in the horizontal direction of the stage 12. A portion where the through hole 124 intersects with the upper surface of the stage 12 and serves as a cooling medium supply port 125 to be described below. In addition, the stage 12 includes a first portion 121 of a columnar or cylindrical region centered on the supply port 125, a second annular portion 122 disposed around the first portion 121, and a third portion 123 for supporting the first portion 121 and the second portion 122. The first portion 121 protrudes upwardly from the second portion 122. When the substrate support member 11 is disposed at the first position, a distance between an inner peripheral surface of the recess portion 212 of the replica template 210 and an outer peripheral surface of the first portion 121 is equal to or less than a predetermined distance. The predetermined distance is a distance at which a flow from the supply port 125 toward an outer periphery of the replica template 210 can be established. For example, the predetermined distance is 2 to 3 mm in the case of using the replica template 210 having a dimension of 6-inch square. That is, a size in the horizontal direction of the first portion 121 is slightly smaller than a size in the horizontal direction of the recess portion 212 of the replica template 210. The substrate support member 11 is provided in the second portion 122. It is noted that the stage 12 is rotatable around a virtual axis passing through the through hole 124 by a driving unit (not illustrated).

The processing liquid supply unit 13 supplies processing liquid used for freeze cleaning. The processing liquid supply unit 13 includes a processing liquid storing unit 131 that stores the processing liquid, a nozzle 132 through which the processing liquid is dropped onto the upper surfaces of the templates 210 and 220, a pipe 133 that connects the nozzle 132 to the processing liquid storing unit 131, and a pump 134 that feeds the processing liquid from the processing liquid storing unit 131 to the nozzle 132 via the pipe 133. As the processing liquid, pure water, deionized water, or the like can be used.

The cooling medium supply unit 14 supplies a cooling medium for cooling the templates 210 and 220 to a temperature equal to or lower than a freezing point of the processing liquid during the freeze cleaning. The cooling medium supply unit 14 includes a cooling medium storing unit 141 that stores the cooling medium, a pipe 142 that connects the cooling medium storing unit 141 to the through hole 124 of the stage 12, and a valve 143 that switches the supply of the cooling medium. As the cooling medium, a gas such as a nitrogen gas cooled to a temperature lower than the freezing point of the processing liquid or liquid such as liquid nitrogen can be used.

The processing apparatus 10 may include a light source 17 for irradiation of ultraviolet light. The light source 17 is disposed above the stage 12 so as to be capable of irradiating regions including the arrangement regions of the uneven patterns 211 and 221 of the templates 210 and 220 in a state where the templates 210 and 220 are held by the substrate support members 11. During the freeze cleaning, the ultraviolet light is irradiated so that the upper surfaces of the templates 210 and 220 are easily receptive of the processing liquid. It is noted that the light source 17 may not be provided in the processing apparatus 10. In this case, the irradiation of the ultraviolet light is performed outside the processing apparatus 10.

In the first embodiment, the substrate support member 11 is movable in the vertical direction (up and down direction) with respect to the upper surface of the stage 12. During the cleaning of the replica template 210, the substrate support member 11 is moved to the first position by the elevating cylinder 15 as illustrated in FIG. 1A. Thus, the first portion 121 of the stage 12 extends into the recess portion 212 on the lower surface of the replica template 210. Thus, the distance between the inner peripheral surface of the recess portion 212 of the replica template 210 and the outer peripheral surface of the first portion 121 becomes the predetermined distance. On the other hand, during the cleaning of the master template 220, as illustrated in FIG. 1B, the substrate support member 11 is moved to the second position by the elevating cylinder 15. Thus, the master template 220 is disposed at a predetermined distance from the upper surface of the first portion 121 of the stage 12.

Figure 3:
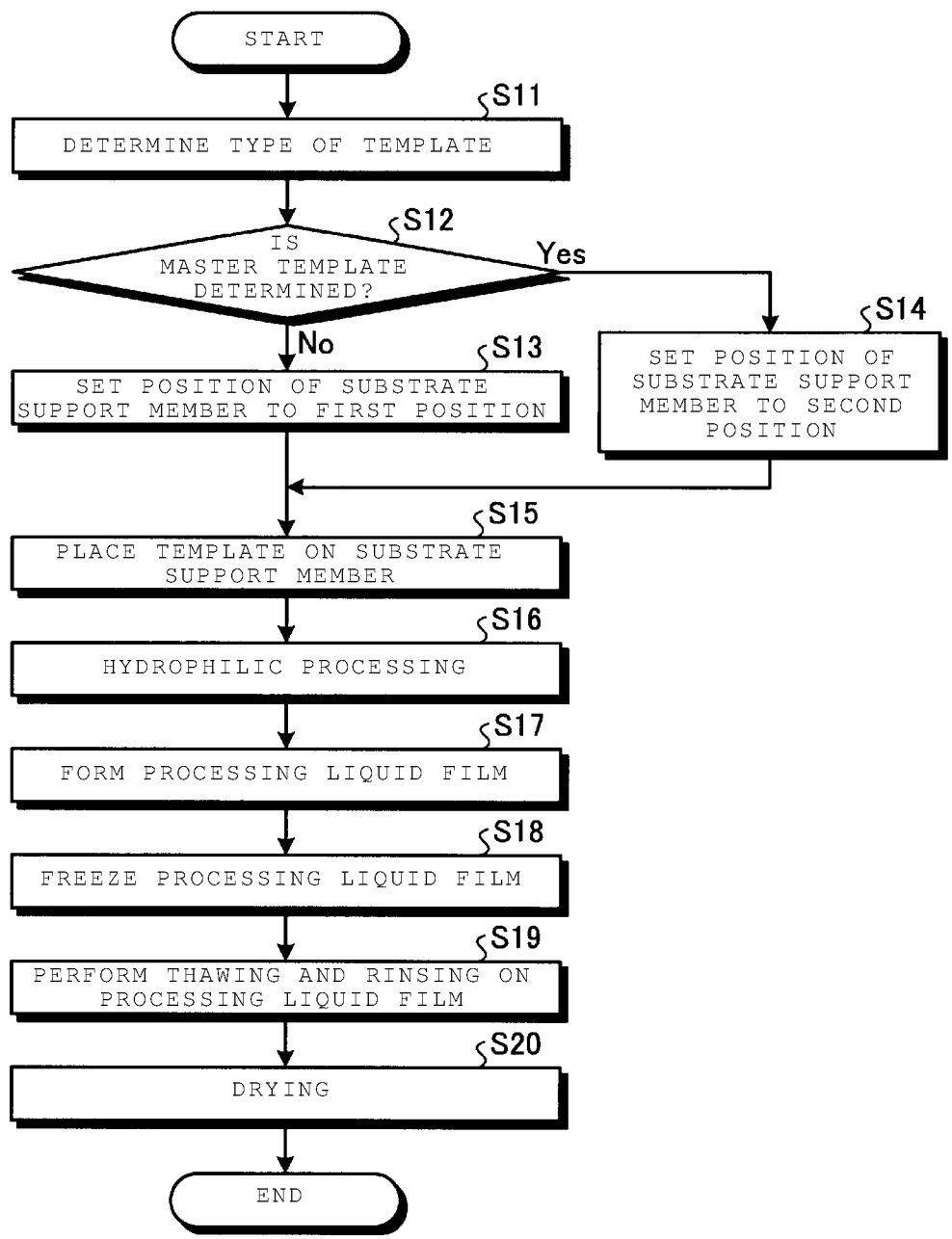
FIG. 3 is a flowchart illustrating an example of a procedure of a processing method according to the first embodiment.

Next, a processing method in such a processing apparatus 10 will be described. FIG. 3 is a flowchart illustrating an example of a procedure of a processing method according to the first embodiment. First, it determines the type of template 210 or 220 to be cleaned, that is, whether the template to be cleaned is a master template 220 or a replica template 210 (step S11), and for example determines whether the template to be cleaned is the master template 220 (step S12). The determination may be performed from a captured image obtained by imaging the lower surfaces of the templates 210 and 220 with an image capturing device (not illustrated), for example, or may be performed by previously storing type information at predetermined positions on the templates 210 and 220 and reading the type information. The type information is, for example, a pattern provided in the templates 210 and 220.

If the template is not a master template 220 (No in step S12), that is, when it is a replica template 210, the position of the substrate support member 11 is set to the first position by the elevating cylinder 15 (step S13). On the other hand, when it is a master template 220 (Yes in step S12), the position of the substrate support member 11 is set to the second position by the elevating cylinder 15 (step S14).

Thereafter, or after step S13, the templates 210 and 220 are placed on the substrate support member 11 (step S15), and are subjected to hydrophilic processing (step S16). Here, as the hydrophilic processing, the light source 17 is turned on, and the ultraviolet light is irradiated to the upper surfaces of the templates 210 and 220 from the light source 17. Then, the processing liquid is supplied to the nozzle 132 from the processing liquid supply unit 13 via the pipe 133, and a processing liquid film is formed on the upper surfaces of the templates 210 and 220 (step S17). As the stage 12 rotates in a horizontal plane around the axis passing through the through hole 124 at this time, the processing liquid film spreads along and into the pattern formation surface in a substantially uniform manner.

Thereafter, the cooling medium is supplied from the cooling medium supply unit 14 to the supply port 125 of the stage 12 via the pipe 142. Thus, the cooling medium discharged from the supply port 125, which is provided at the center of the stage 12 (first portion 121), flows toward the outer periphery of the first portion 121 through a gap provided between the lower surface of the template 210 or 220 and the upper surface of the first portion 121. At this time, since the lower surfaces of the templates 210 and 220 are in contact with the cooling medium, the templates 210 and 220 are cooled from the lower surface side thereof. Then, when a temperature on the upper surface side of the template 210 or 220 reaches a temperature equal to lower than the freezing point of the processing liquid, the processing liquid film freezes (step S18). The processing liquid film freezes from the part in contact with the template 210 or 220 upward.

After the processing liquid film has frozen, the valve 143 is closed to stop the supply of the cooling medium from the cooling medium supply unit 14, the processing liquid film is thawed, and the processing liquid is again supplied from the processing liquid supply unit 13 to the upper surfaces of the templates 210 and 220 via the nozzle 132 to perform rinsing (step S19) of the template 210 or 220. The thawing and rinsing of the processing liquid film may be carried out after the processing liquid film has frozen over its entire film thickness, or may be carried out after a portion of the processing liquid film having a predetermined thickness, for example, about 100 nm, from a boundary thereof with the template 210 or 220 has frozen. Thereafter, the templates 210 and 220 are subjected to drying (step S20), and the cleaning of the templates 210 and 220 is completed.

Figure 4A:
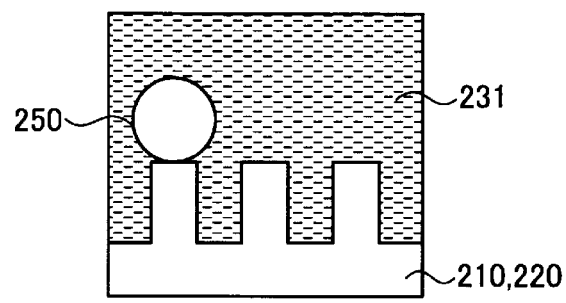
FIGS. 4A to 4C are cross-sectional views of a template and pattern thereof schematically illustrating a state of a cleaning process using freeze cleaning.
Figure 4B:
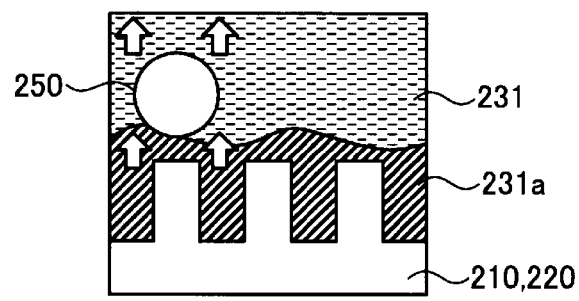
Figure 4C:
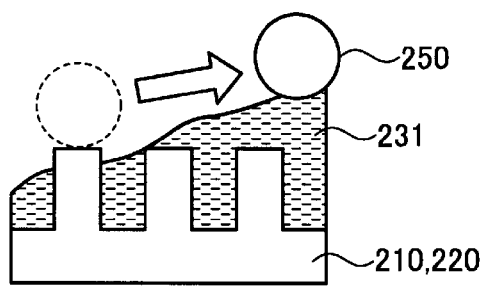

FIGS. 4A to 4C are cross-sectional views schematically illustrating a state of a cleaning process by freeze cleaning. As illustrated in FIG. 4A, foreign substances (particles) 250 adhere to the templates 210 and 220 to be cleaned by the processing method of FIG. 3. In step S17 of forming the processing liquid film, the processing liquid film 231 flows upward, but the processing liquid hardly moves in a distance of about 100 nm from the boundary thereof with the template 210 or 220. For this reason, when the size of the foreign substance 250 present on the template 210 or 220 is larger than 100 nm, the foreign substance is removed by the flow of the processing liquid on the upper surface of the template 210 or 220. However, the foreign substance 250 having a size equal to or smaller than 100 nm and being present in the range of about 100 nm from the boundary with the template 210 and 220 remains without being removed by the processing liquid due to no flow of the processing liquid adjacent to the boundary of the processing fluid with the template 210 or 220.

In step S18 of freezing the processing liquid film, a frozen layer 231a is formed of the processing liquid film 231 on the upper surface side of the template 210 or 220. As illustrated in FIG. 4B, since the volume of the processing liquid film 231 expands when the processing liquid film 231 freezes into the frozen layer 231a, the foreign substance 250 adhered to the surfaces of the templates 210 and 220 is lifted by the formation of the frozen layer 231a and away from the surfaces of the templates 210 and 220. Thereafter, in step S19 of thawing and rinsing the processing liquid film, as illustrated in FIG. 4C, the foreign substance 250 lifted from the surfaces of the templates 210 and 220 flows along with the processing liquid supplied from the nozzle 132 at the time of thawing the processing liquid film 231, and thus the foreign substance 250 is removed.

Figure 5A:
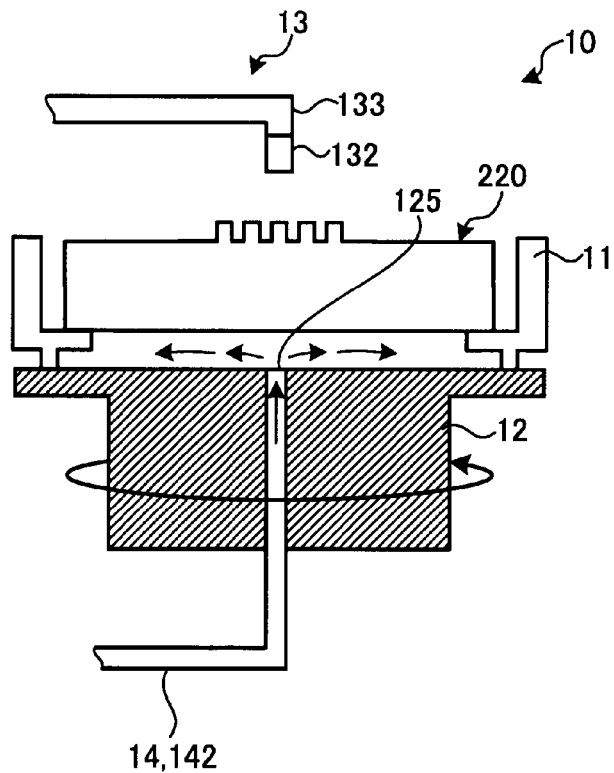
FIGS. 5A and 5B are views schematically illustrating a state of a cleaning process of a template and pattern thereof using a processing apparatus according to a comparative example.
Figure 5B:
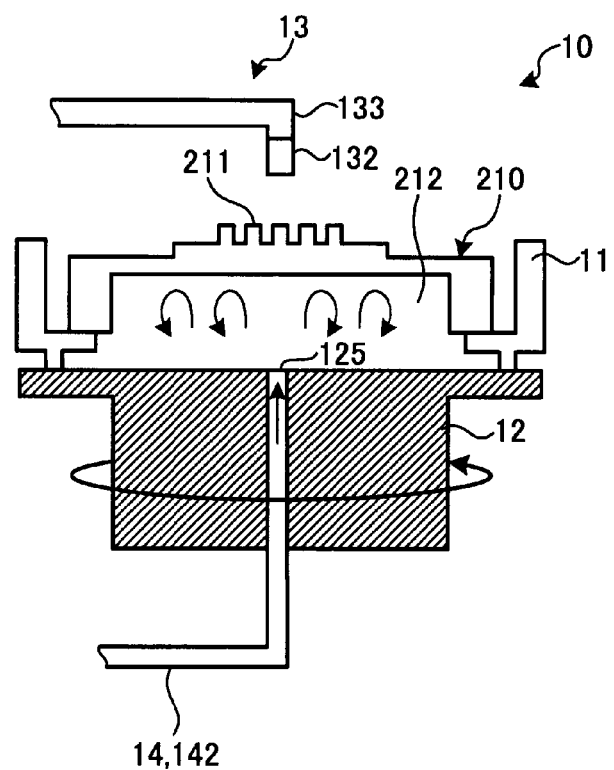

Next, effects of the first embodiment will be described compared with the comparative example. FIGS. 5A and 5B are views schematically illustrating a state of a cleaning process of a processing apparatus according to the comparative example; FIG. 5A is a view illustrating a processing state of the master template, and FIG. 5B is a view illustrating a processing state of the replica template. A processing apparatus 10 according to the comparative example has a configuration in which an upper surface of a stage 12 is flat and a substrate support member 11 is fixed onto the stage 12 and cannot move in the vertical direction. That is, the processing apparatus 10 according to the comparative example has a configuration suitable for performing a freeze cleaning process of a substrate having a flat lower surface.

As illustrated in FIG. 5A, when the master template 220 is processed, since the lower surface of the master template 220 is disposed at a predetermined distance from the upper surface of the stage 12 by the fixed in place substrate support members 11, a cooling medium blown out from a supply port 125 provided at the center of the stage 12 uniformly flows toward an outer periphery of the master template 220. Thus, the cooling temperature of the upper surface of the master template 220 becomes substantially uniform, and outside air is prevented from entering a space between the master template 220 and the stage 12.

As illustrated in FIG. 5B, when the replica template 210 is processed, since a recess portion 212 is formed on a lower surface of the replica template 210, an unnecessary gap is formed between the center regions of the template 210 and stage 12, resulting in making it difficult to control or prevent an air flow and air circulation in the recess portion. That is, the cooling medium blown out from a supply port 125 provided at the center of the stage 12 does not uniformly flow toward the outer periphery of the stage 12 but forms a complicated flow pattern. Thus, the cooling temperature of the upper surface of the replica template 210 becomes non-uniform. In addition, due to the complicated air flow, outside air is trapped in the space between the replica template 210 and the stage 12 in the vicinity of a periphery of the stage 12. Since the air contains moisture, frost is formed on the lower surface (an inner peripheral surface of the recess portion 212) of the replica template 210 due to the cooling of the trapped air. In the processing apparatus 10 according to the comparative example as described above, it is difficult to maintain reproducibility of cleaning during processing when the replica template 210 is subjected to the cleaning, and it is also difficult to prevent the formation of frost.

On the other hand, the processing apparatus 10 according to the first embodiment is provided with the stage 12 including the first portion 121 protruding upward from the second portion 122 and having the supply port 125 for the cooling medium at the center and the substrate support member 11 fixed to the second portion 122 and movable in the vertical direction. Then, when the replica template 210 is subjected to the cleaning, the substrate support member 11 is disposed at the first position where the first portion 121 fits in the recess portion 212 of the replica template 210 at a predetermined interval or distance from the facing surface of the replica template 210, and when the master template 220 is subjected to the cleaning, the substrate support member 11 is disposed at a second position in which the flat lower surface of the master template 220 is disposed at the predetermined interval from the upper surface of the first portion 121, the second position being higher from the second portion 122 than the first position, and the predetermined intervals or thicknesses being substantially the same. Thus, when the replica template 210 is subjected to the cleaning, the cooling medium flows into the gap having the predetermined thickness formed between the recess portion 212 of the replica template 210 and the first portion 121 when the cooling medium is supplied from the supply port 125, and the cooling medium uniformly flows from the center of the stage 12 toward the outer periphery thereof. That is, as in the comparative example of FIG. 5B, since the complicated air flow pattern does not occur in the recess portion 212 of the replica template 210, outside air is prevented from being trapped at the periphery of the replica template 210. As a result, it is possible to make the cooling temperature of the upper surface of the replica template 210 uniform which cannot be achieved in the comparative example, and to prevent the formation of frost on the lower surface (the inner peripheral surface of the recess portion 212) of the replica template 210.

Even when the master template 220 is subjected to the cleaning, as in the comparative example of FIG. 5A, the cooling medium can uniformly flow into the gap having the predetermined thickness between the first portion 121 of the stage 12 and the lower surface of the master template 220. In the first embodiment, however, since the size in the horizontal plane of the first portion 121 is smaller than the size of the lower surface of the master template 220, the flow of the cooling medium is not uniform in the region outside the perimeter of the first portion 121. Thus, there is a possibility that the air inside the processing apparatus 10 is cooled and frost is formed on the periphery of the back surface of the template 220. However, in the region on the lower surface side corresponding to the uneven pattern 221, the cooling temperature can be made uniform below the uneven pattern 221 due to the uniform flow of the cooling medium. In addition, due to the uniform flow of the cooling medium, the outside air cannot enter the region on the lower surface side corresponding to the uneven pattern 221, and thus in the region on the lower surface side corresponding to the arrangement region of the uneven pattern 221, frost is not formed and no problematic cooling characteristics occur.

In the processing apparatus 10 according to the first embodiment as described above, even when the types of the templates 210 and 220 are different from each other, the cooling temperature of the upper surface thereof can be made uniform in the patterned regions thereof, and the temperature of the upper surfaces of the templates 210 and 220 can be uniformly cooled with good reproducibility.

Second Embodiment

Figure 6A:
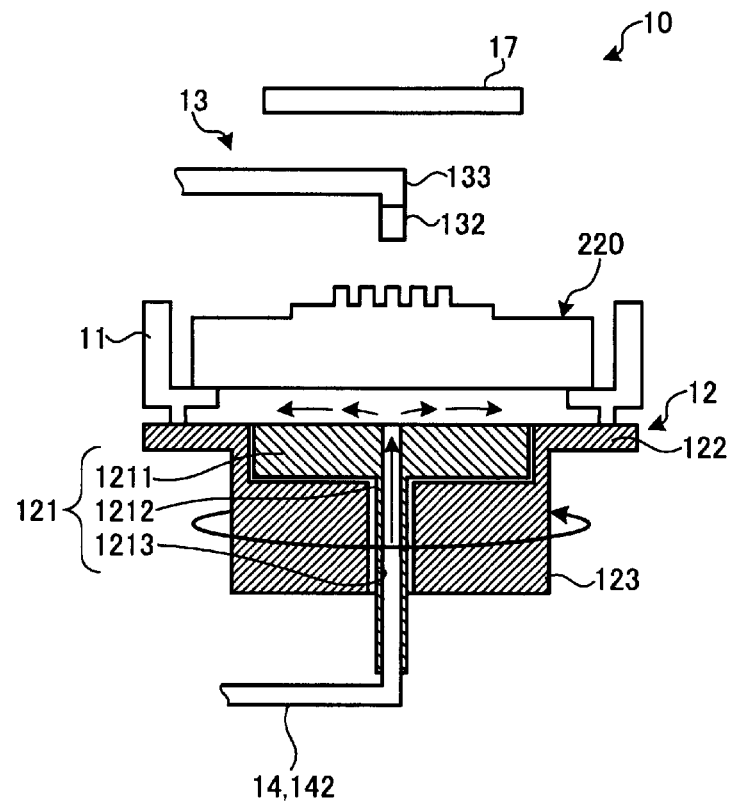
FIGS. 6A and 6B are cross-sectional views schematically illustrating an example of a configuration of a processing apparatus according to a second embodiment.
Figure 6B:
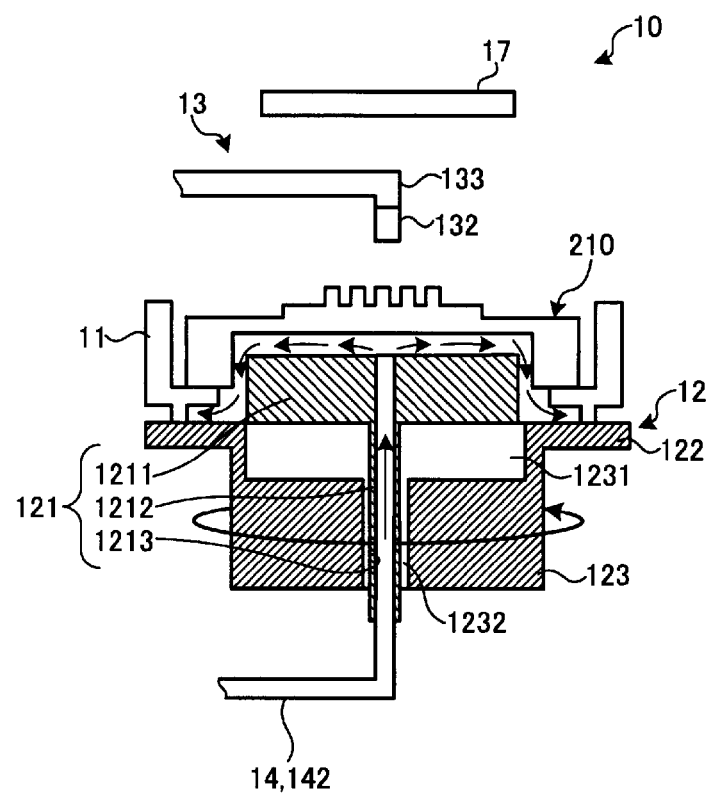

FIGS. 6A and 6B are cross-sectional views schematically illustrating an example of a configuration of a processing apparatus according to a second embodiment; FIG. 6A is a cross-sectional view at the time of cleaning a master template, and FIG. 6B is a cross-sectional view of the processing apparatus at the time of cleaning a replica template. In a processing apparatus 10 according to the second embodiment, a first portion 121 of a stage 12 is movable in a vertical direction with respect to a second portion 122 and a third portion 123 thereof. When a replica template 210 is processed, a first portion 121 is moved to a first position illustrated in FIG. 6B, at which the upper surface of the first portion 121 protrudes above and from the upper surface of the second portion 122, by a driving unit (not illustrated). When the master template 220 is processed, the first portion 121 is moved by the driving unit (not illustrated) to a second position illustrated in FIG. 6A, at which the upper surface of the first portion 121 is in a plane parallel to the upper surface of the second portion 122.

For example, in the examples of FIGS. 6A and 6B, the first portion 121 includes a disk-shaped plate 1211 and a support member 1212 provided near the center of a lower surface of the plate 1211. A through hole 1213 is provided in the plate 1211 and the support member 1212 and penetrates through the center of the plate 1211 in the vertical direction. In addition, the third portion 123 is provided with a recess portion 1231 in which the first portion 121 is accommodated and a through hole 1232 through which the support member 1212 of the first portion 121 is inserted. A depth of the recess portion 1231 is substantially equal to a thickness, i.e., height, of the plate 1211 of the first portion 121 above the second portion 122. The support member 1212 of the first portion 121 extends from a lower side of the third portion 123, the protruding support member 1212 is vertically moved in the vertical direction by a driving unit (not illustrated) such as a motor, and thus the first portion 121 can be moved. In the second embodiment, the second portion 122 and the third portion 123 rotate, but the first portion 121 may rotate or may not rotate.

In addition, the substrate support member 11 is fixed to the second portion 122 of the stage 12, and the elevating cylinder 15 is not provided, unlike in the first embodiment. That is, the substrate support member 11 does not move in the vertical direction.

In the second embodiment different from the first embodiment in which the position of the substrate support member 11 is changed according to the type of the templates 210 and 220, the position of the first portion 121 of the stage 12 is changed. The same components as those of the first embodiment are denoted by the same reference numerals, and the description thereof will not be presented.

In the second embodiment, the first portion 121 can protrude or extend in the vertical direction from the second portion 122. Thus, when the master template 220 is subjected to cleaning, a gap having the predetermined interval is formed between the lower surface of the master template 220 and the upper surface of the stage 12, and thus the entire lower surface of the master template 220 can be uniformly cooled. As a result, as in the first embodiment, it is possible to obtain an effect of preventing the formation of frost on a peripheral part of the lower surface of the master template 220 in addition to the effect of the first embodiment.

Third Embodiment

Figure 7A:
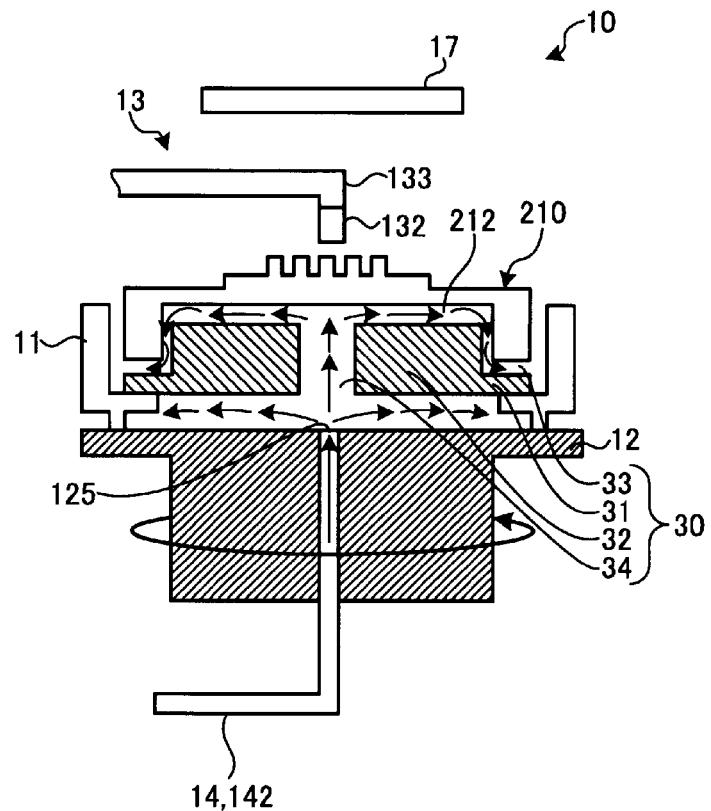
FIGS. 7A and 7B are cross-sectional views schematically illustrating an example of a configuration of a processing apparatus according to a third embodiment.
Figure 7B:
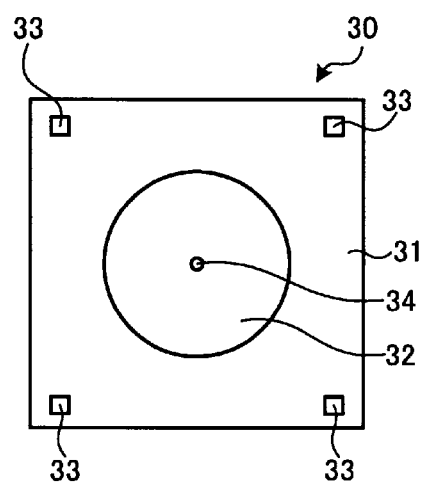

FIGS. 7A and 7B are cross-sectional views schematically illustrating an example of a configuration of a processing apparatus according to a third embodiment; FIG. 7A is a cross-sectional view at the time of cleaning a replica template, and FIG. 7B is a top view schematically illustrating an example of a substrate holder. In a processing apparatus 10 according to the third embodiment, the upper surface of a stage 12 of the processing apparatus 10 is flat, and the second portion 122 and the first portion 121 protruding or extending from the second portion 122 are not provided, unlike in the first embodiment. That is, the processing apparatus includes the stage 12 the same as that of processing apparatus 10 according to the comparative example in FIG. 5.

Further, the processing apparatus 10 further includes a substrate holder 30 that holds a replica template 210. As illustrated in FIG. 7B, the substrate holder 30 includes a rectangular base portion 31, a projection or extension portion 32 provided near the center of the base portion 31, substrate contact portions 33 provided at predetermined positions of the base portion 31 and supporting the templates 210 and 220, and a through hole 34 penetrating the center of the projection portion 32 in the thickness direction. A size in a horizontal direction of the base portion 31 is substantially equal to that in the horizontal direction of the template 210 or 220. A size in the horizontal direction of the projection portion 32 is slightly smaller than the size in the horizontal direction of the recess portion 212 of the replica template 210. When the replica template 210 is placed on the substrate holder 30, the size of the projection portion 32 is determined such that a distance between an outer peripheral surface of the projection portion 32 and an inner peripheral surface of the recess portion 212 of the replica template 210 is a predetermined distance. The substrate contact portions 33 are provided at four corners of the base portion 31, for example. The same components as those of the above-described processing apparatus 10 are denoted by the same reference numerals, and the description thereof will not be presented.

In the processing apparatus 10 according to the third embodiment, when the master template 220 is processed, the substrate holder 30 is not used and the master template 220 is placed directly on the substrate support member 11. This is the same as that illustrated in FIG. 5A of the comparative example. In this case, as illustrated in FIG. 5A, the upper surface of the stage 12 and the lower surface of the master template 220 are arranged at a predetermined interval, and the cooling medium supplied from the supply port 125 uniformly flows from the center of the stage 12 toward the outer periphery. Therefore, it is possible to uniformly cool the upper surface of the master template 220 with good reproducibility.

On the other hand, when the replica template 210 is processed, the substrate holder 30 is placed on the substrate support member 11 and the replica template 210 is placed on the substrate holder 30. In this case, as illustrated in FIG. 7A, the cooling medium supplied from the supply port 125 passes through the through hole 34 of the substrate holder 30, and uniformly flows from the center of the substrate holder 30 toward the outer periphery through a space provided between the projection portion 32 of the substrate holder 30 and the recess portion 212 of the replica template 210. Therefore, it is possible to uniformly cool the upper surface of the replica template 210 with good reproducibility.

Figure 8:
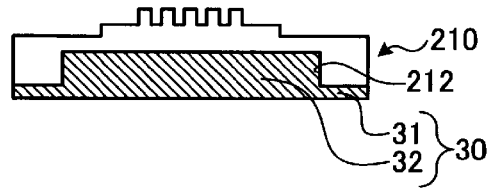
FIG. 8 is a cross-sectional view schematically illustrating another example of a substrate holder used in the processing apparatus according to the third embodiment.

In the case of FIGS. 7A and 7B, the projection portion 32 of the substrate holder 30 and the facing surface of the recess portion 212 of the replica template 210 are arranged at the predetermined interval, which is merely an example, but may be configured in another form. FIG. 8 is a cross-sectional view schematically illustrating another example of a substrate holder used in the processing apparatus according to the third embodiment. The substrate holder 30 illustrated in FIG. 8 has a configuration in which when the replica template 210 is placed on the substrate holder 30, the upper surface including the projection portion 32 of the substrate holder 30 comes in contact with the lower surface including the recess portion 212 of the replica template 210. Further, the substrate holder 30 is not provided with the substrate contact portion 33 and the through hole 34. In this case, the substrate holder 30 is made of a material having high heat conduction. An example of a material having high heat conduction may include aluminum, a metal material such as iron, or aluminum oxide, and a replica template 210 can be cleaned on the apparatus of FIG. 5, wherein the substrate holder is supported, at its corners, by the substrate support apparatus 11.

When the cooling medium comes into contact with the substrate holder 30, the substrate holder 30 is cooled. Since the substrate holder 30 is in contact with the replica template 210, the replica template 210 is also cooled. Therefore, it is possible to uniformly cool the upper surface of the replica template 210 with good reproducibility.

According to the third embodiment, the same effects as those of the first and second embodiments can also be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A processing apparatus for processing substrates of a first type having a recess including a recess formed of a peripheral surface extending inwardly of the rear surface side thereof and ending in an inner generally flat wall and substrates wherein the rear surface side is flat, comprising:
    a stage including a flat upper surface, through which a flow passage extending through the stage opens, and a substrate support;
    a removable substrate holder comprising a flat plate-like base portion having substantially the same size as a substrate of the first type and a projection portion having a size receivable within the recess of the substrate of the first type;
    a processing liquid pipe overlying the flat upper surface, and configured to drop a processing liquid onto the substrate of the first type when on the substrate support; and
    a cooling medium pipe coupled to the flow passage.

2. The processing apparatus according to 1, wherein the substrate holder further comprises a substrate contact portion on the base portion and configured to support the substrate of the first type and a through hole extending through the projection portion.

3. The processing apparatus according to 2, wherein the projection portion is sized such that a distance between a peripheral surface of the recess and an outer peripheral surface of the projection portion is a predetermined distance when the first substrate of the first type is held by the substrate holder.

4. The processing apparatus according to claim 1, wherein the substrate support includes a sidewall portion and support portion, and
    the substrate holder rests on the substrate support when the substrate holder is installed.

5. The processing apparatus according to claim 1, wherein the substrate holder rests on the substrate support when the substrate holder is installed.

6. The processing apparatus according to claim 1, wherein the substrate support is disposed on a corner portion of the flat upper surface of the stage.

7. The processing apparatus according to claim 1, wherein the substrate support includes a sidewall portion and support portion.

8. A processing apparatus for processing substrates, comprising:
- a stage having a flat upper surface, the stage having a flow passage with an opening at a central portion of the flat upper surface;
- a substrate support on an outer peripheral portion of the flat upper surface of the stage, the substrate support leaving the central portion of the flat upper surface uncovered;
- a removable substrate holder comprising a flat plate-like base portion having substantially the same planar size as a substrate and a projection portion configured to fit within a recess of the substrate, the removable substrate holder having a through hole extending through both the base portion and the projection portion and corresponding in position with the flow passage and a plurality of contact portions on the base portion that are configured to hold the substrate at a distance above the base portion;
- a processing liquid pipe overlying the flat upper surface and configured to dispense a processing liquid onto the substrate when the substrate is resting on the substrate support; and
- a cooling medium pipe coupled to the flow passage, wherein the removable substrate holder rests on the substrate support.

9. The processing apparatus according to 8, wherein
the base portion of the removable substrate holder is rectangular, and
the plurality of contact portions are disposed on corner portions of the base portion.

10. The processing apparatus according to claim 9, wherein the projection portion is circular.

11. The processing apparatus according to 10, wherein the diameter of the projection portion is set to be less than the diameter of the recess of the substrate.

12. The processing apparatus according to claim 11, wherein
the substrate support includes a sidewall portion and support portion, and
the removable substrate holder rests on the support portion of the substrate support when the removable substrate holder is installed.

13. The processing apparatus according to claim 8, wherein
the substrate support includes a sidewall portion and support portion, and
the removable substrate holder rests on the support portion of the substrate support when the removable substrate holder is installed.

14. The processing apparatus according to claim 8, wherein the substrate support is disposed on a corner portion of the flat upper surface of the stage.

15. The processing apparatus according to claim 8, wherein the substrate support includes a sidewall portion and support portion.

\* \* \* \* \*